(12) United States Patent
Yamada et al.

(10) Patent No.: US 8,436,419 B2
(45) Date of Patent: May 7, 2013

(54) SEMICONDUCTOR DEVICE WITH HIGH-BREAKDOWN-VOLTAGE TRANSISTOR

(75) Inventors: Akira Yamada, Nukata-gun (JP); Nozomu Akagi, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 15 days.

(21) Appl. No.: 13/291,162

(22) Filed: Nov. 8, 2011

(65) Prior Publication Data

US 2012/0049271 A1 Mar. 1, 2012

Related U.S. Application Data

(62) Division of application No. 12/289,853, filed on Nov. 6, 2008, now Pat. No. 8,097,921.

(30) Foreign Application Priority Data

Nov. 9, 2007 (JP) ................................ 2007-292047
Sep. 10, 2008 (JP) ................................ 2008-231833

(51) Int. Cl.
*H01L 29/78* (2006.01)
*H01L 29/02* (2006.01)

(52) U.S. Cl.
USPC ........... 257/329; 257/242; 257/263; 257/397; 257/500; 257/501; 257/513

(58) Field of Classification Search ................ 257/329, 257/356, 500, 501, 242, 263, 397, 513, E29.002, 257/E29.262
See application file for complete search history.

(56) References Cited

U.S. PATENT DOCUMENTS

| 6,124,628 | A | * | 9/2000 | Fujihira et al. | ................ | 257/630 |
| 6,307,232 | B1 | * | 10/2001 | Akiyama et al. | ............... | 257/347 |
| 6,323,539 | B1 | * | 11/2001 | Fujihira et al. | ................ | 257/630 |
| 6,693,338 | B2 | * | 2/2004 | Saitoh et al. | .................. | 257/492 |

(Continued)

FOREIGN PATENT DOCUMENTS

JP A-02-248018 10/1990
JP A-04-171765 6/1992

(Continued)

OTHER PUBLICATIONS

First Office Action mailed on Feb. 24, 2010 issued from the Chinese Patent Office in the corresponding Chinese patent application No. 200810170454.8 (and English translation).

(Continued)

*Primary Examiner* — Long Tran
*Assistant Examiner* — Jordan Klein
(74) *Attorney, Agent, or Firm* — Posz Law Group, PLC

(57) ABSTRACT

A semiconductor device includes a high-breakdown-voltage transistor having a semiconductor layer. The semiconductor layer has an element portion and a wiring portion. The element portion has a first wiring on a front side of the semiconductor layer and a backside electrode on a back side of the semiconductor layer. The element portion is configured as a vertical transistor that causes an electric current to flow in a thickness direction of the semiconductor layer between the first wiring and the backside electrode. The backside electrode is elongated to the wiring portion. The wiring portion has a second wiring on the front side of the semiconductor layer. The wiring portion and the backside electrode provide a pulling wire that allows the electric current to flow to the second wiring.

3 Claims, 16 Drawing Sheets

U.S. PATENT DOCUMENTS

| | | | |
|---|---|---|---|
| 7,239,181 B2 * | 7/2007 | Himi et al. | 326/82 |
| 7,781,894 B2 * | 8/2010 | Oikawa | 257/774 |
| 2006/0071271 A1 * | 4/2006 | Omura et al. | 257/341 |
| 2006/0108666 A1 * | 5/2006 | Koizumi | 257/621 |
| 2006/0231868 A1 * | 10/2006 | Yamada et al. | 257/239 |
| 2006/0249807 A1 * | 11/2006 | Akiyama | 257/499 |
| 2007/0013022 A1 * | 1/2007 | Shimizu | 257/500 |
| 2007/0080395 A1 * | 4/2007 | Wahl et al. | 257/328 |
| 2007/0085595 A1 * | 4/2007 | Taki et al. | 327/534 |
| 2007/0132017 A1 | 6/2007 | Oikawa | |
| 2008/0135932 A1 * | 6/2008 | Ozeki et al. | 257/334 |

FOREIGN PATENT DOCUMENTS

| | | |
|---|---|---|
| JP | A-11-330456 | 11/1999 |
| JP | A-2001-044357 | 2/2001 |
| JP | A-2001-313828 | 11/2001 |
| JP | A-2007-317839 | 12/2007 |

OTHER PUBLICATIONS

Office Action mailed Apr. 27, 2010 issued from the Japan Patent Office in the corresponding patent application No. 2008-231833 (and English translation).

* cited by examiner

SEMICONDUCTOR DEVICE WITH HIGH-BREAKDOWN-VOLTAGE TRANSISTOR

CROSS REFERENCE TO RELATED APPLICATION

This application is a divisional of U.S. application Ser. No. 12/289,853 filed on Nov. 6, 2008, and allowed on Oct. 3, 2011, which is based on and incorporates herein by reference Japanese Patent Applications No. 2007-292047 filed on Nov. 9, 2007 and No. 2008-231833 filed on Sep. 10, 2008.

FIELD OF THE INVENTION

The present invention relates to a semiconductor device with a high-breakdown-voltage transistor, in particular, a high-breakdown metal-oxide semiconductor field-effect transistor for level shifting.

BACKGROUND OF THE INVENTION

Conventionally, a high-voltage integrated circuit (HVIC) has been proposed that achieves a level shift circuit without using a photocoupler. For example, such a HVIC includes a high-breakdown-voltage laterally diffused metal-oxide semiconductor transistor (LDMOS) for level shifting. As disclosed, for example, in US 2006/0249807 corresponding to JP-A-2006-313828, in a high-breakdown-voltage LDMOS, a drain region is placed in the center, and a source region is placed around the periphery of the drain region. Thus, the source region is concentrically arranged with respect to the drain region to eliminate a singular point. In such an approach, an electric current almost uniformly flows so that the LDMOS can have a high breakdown voltage.

FIG. 16 is a diagram illustrating a cross-sectional view of such a LDMOS. An n-type well region J2 and an $n^+$-type contact region J3 are formed in an $n^-$-type drift layer J1. The n-type well region J2 and the $n^+$-type contact region J3 construct a drain region. A p-type channel region J4 and an $n^+$-type source region J5 are formed around the drain region. A drain wiring J6 is formed on a surface of the $n^+$-type contact region J3. A source wiring J7 is formed on a surface of the $n^+$-type source region J5. Since the drain region is surrounded by the $n^+$-type source region J5, the drain wiring J6 passes above the source wiring J7 when being pulled outside the source wiring J7.

An interlayer insulation film J8 is interposed between the drain wiring J6 and the source wiring J7 for electrical insulation between the drain wiring J6 and the source wiring J7. Typically, in a high-breakdown-voltage LDMOS for level shifting, a potential of 0 volt is applied to the source wiring J7, and a potential of from about 600 volts to about 1200 volts is applied to the drain wiring J6. That is, a voltage of from about 600 volts to about 1200 volts is applied to the interlayer insulation film J8, which is interposed between the drain wiring J6 and the source wiring J7. Therefore, the thickness of the interlayer insulation film J8 needs to be large enough to prevent breakdown of the interlayer insulation film J8. However, it takes a long time to form an interlayer insulation film that has a large thickness.

FIG. 17 is a diagram illustrating a potential distribution in the LDMOS. As can be seen from FIG. 17, in the $n^-$-type drift layer J1, the potential distribution is uniform around the n-type well region J2. However, in the interlayer insulation film J8 and a LOCOS oxide film J9 located below the drain wiring J6, the potential distribution is nonuniform. The nonuniform potential distribution indicates that an electric field concentration occurs due to a high potential of the drain wiring J6. The electric field concentration may result in breakdown of the interlayer insulation film J8 and the LOCOS oxide film J9.

The problems described above can arise other types of high-breakdown-voltage transistors such as an insulated gate bipolar transistor (IGBT) and a bipolar transistor.

SUMMARY OF THE INVENTION

In view of the above, it is an object of the present invention to provide a semiconductor device that achieves a high-breakdown-voltage transistor without increasing the thickness of an insulation film.

According to a first aspect of the present invention, a semiconductor device includes a high-breakdown-voltage transistor having a semiconductor layer of a predetermined conductivity type. The semiconductor layer has an element portion and a wiring portion that are electrically isolated from each other by a trench. The element portion has a first wiring member on a front side of the semiconductor layer and a backside electrode on a back side of the semiconductor layer. The element portion is configured as a vertical transistor that causes an electric current to flow in a thickness direction of the semiconductor layer between the first wiring member and the backside electrode. The backside electrode is elongated from the element portion to the wiring portion. The wiring portion has a second wiring member on the front side of the semiconductor layer and the backside electrode on the back side of the semiconductor layer. The wiring portion is configured as a pulling wire that allows the electric current to flow between the backside electrode and the second wiring member.

According to a second aspect of the present invention, a semiconductor device includes a high-breakdown-voltage transistor, an insulation film, and a backside electrode. The high-breakdown-voltage transistor has a semiconductor layer of a first conductivity type. The semiconductor layer has an element portion and a wiring portion that are electrically isolated from each other by a first trench. The insulation film is formed on a front side of the semiconductor layer and has first and second contact holes. The backside electrode is formed on a backside of the semiconductor layer. The element portion of the high-breakdown-voltage transistor includes a channel layer of a second conductivity type, a semiconductor region of the first conductivity type, a gate insulation film, a gate electrode, a first wiring member, and a drain contact region of the first conductivity type. The channel layer is formed to the semiconductor layer and exposed to the first side of the semiconductor layer. The semiconductor region is formed in the channel layer and has an impurity concentration higher than that of the semiconductor layer. The gate insulation film is formed on an exposed surface of the channel layer between the semiconductor region and the semiconductor layer. The gate electrode is formed on the gate insulation film. The first wiring member is electrically coupled to each of the semiconductor region and a contact region of the channel layer. The drain contact region is formed on the back side of the semiconductor layer and has an impurity concentration higher than that of the semiconductor layer. The wiring portion of the high-breakdown-voltage transistor includes a first contact region, a second contact region, and a second wiring member. The first contact region is formed on the front side of the semiconductor layer. The second contact region is formed on the back side of the semiconductor layer. The second wiring member is electrically coupled to the first contact region. The drain contact region of the element portion is electrically coupled to the second contact region of the wiring portion by the backside electrode. The first wiring member is electrically coupled to each of the semiconductor region and the contact region of the channel layer through the first contact hole of the first insulation film. The second wiring member is electrically coupled to the first contact region of the wiring portion through the second contact hole of the first insulation film.

According to a third aspect of the present invention, a semiconductor device includes a low voltage circuit section, a high voltage circuit section, a high-breakdown-voltage transistor, and a power supply wiring. The high-breakdown-voltage transistor is configured to perform power conversion between the low voltage circuit section and the high voltage circuit section. The high-breakdown-voltage transistor has a semiconductor layer of a predetermined conductivity type. The semiconductor layer has an element portion electrically isolated by a trench. The power supply wiring is formed on a first side of the semiconductor layer and configured to apply a voltage to the high voltage circuit section. The element portion has a wiring member on the front side of the semiconductor layer and a lead frame on the back side of the semiconductor layer. The element portion is configured as a vertical transistor that causes an electric current to flow in a thickness direction of the semiconductor layer between the wiring member and the lead frame. The lead frame has a projection projecting from an edge of the back side of the semiconductor layer. The projection of the lead frame is electrically coupled to the power supply wiring through a bonding wire.

According to a fourth aspect of the present invention, a semiconductor device includes a low voltage circuit section, a high voltage circuit section, a high-breakdown-voltage transistor, and a power supply wiring. The high-breakdown-voltage transistor is configured to perform power conversion between the low voltage circuit section and the high voltage circuit section. The high-breakdown-voltage transistor has a semiconductor layer of a first conductivity type. The semiconductor layer has an element portion electrically isolated by a trench. The power supply wiring is formed on the first side of the semiconductor layer and configured to apply a voltage to the high voltage circuit section. The element portion of the high-breakdown-voltage transistor includes a channel layer of a second conductivity type, a semiconductor region of the first conductivity type, a gate insulation film, a gate electrode, a wiring member, a drain contact region of the first conductivity type, and a lead frame. The channel layer is formed to the semiconductor layer and exposed to the first side of the semiconductor layer. The semiconductor region is formed in the channel layer and has an impurity concentration higher than that of the semiconductor layer. The gate insulation film is formed on an exposed surface of the channel layer between the semiconductor region and the semiconductor layer. The gate electrode is formed on the gate insulation film. The wiring member is electrically coupled to each of the semiconductor region and a contact region of the channel layer. The drain contact region is formed on the back side of the semiconductor layer and has an impurity concentration higher than that of the semiconductor layer. The lead frame is formed on the back side of the semiconductor layer and electrically coupled to the drain contact region. The element portion is configured as a vertical transistor that causes an electric current to flow in a thickness direction of the semiconductor layer between the wiring member and the lead frame. The lead frame has a projection projecting from an edge of the back side of the semiconductor layer. The projection of the lead frame is electrically coupled to the power supply wiring through a bonding wire.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
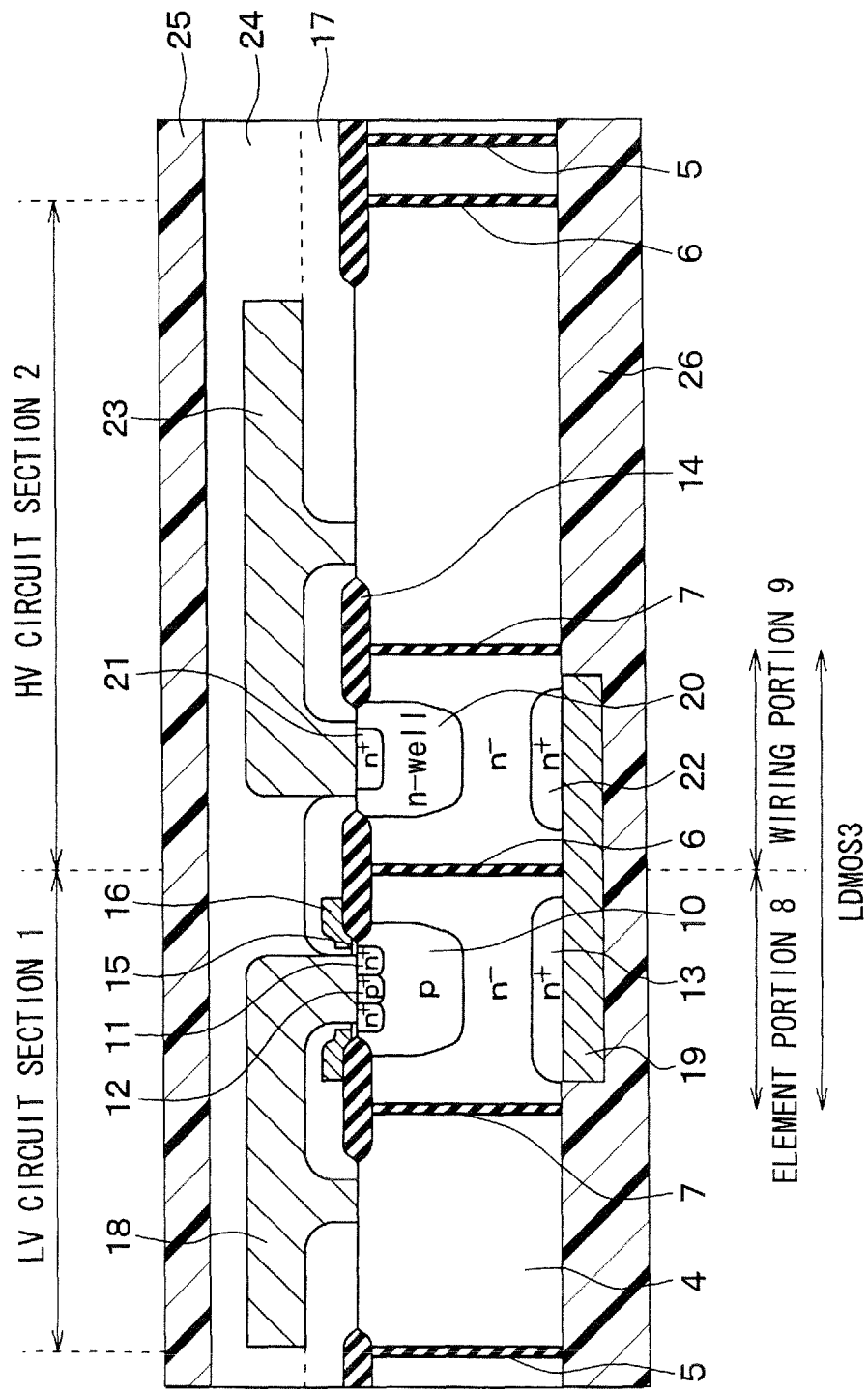
FIG. 1 is a diagram illustrating a cross-sectional view of a semiconductor device according to a first embodiment of the present invention.
Figure 2:
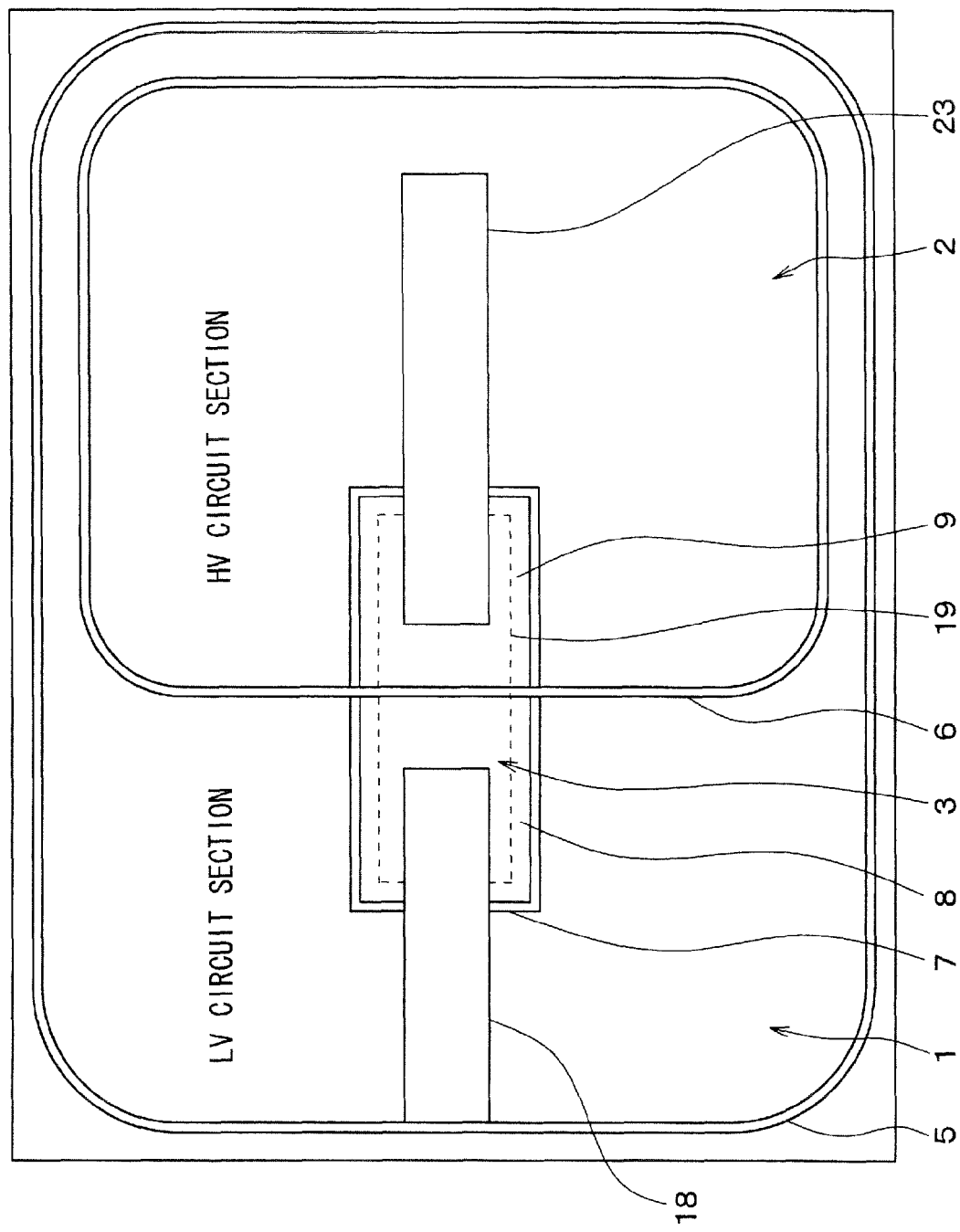
FIG. 2 is a diagram illustrating a front side view of the semiconductor device of FIG. 1.

A semiconductor device according to a first embodiment of the present invention is described below with reference to FIGS. 1 and 2. FIG. 1 is a diagram illustrating a cross-sectional view of a semiconductor chip to which the semiconductor device is formed. The semiconductor chip has a front side (upper side of FIG. 1) and a back side (lower side of FIG. 1) opposite to the front side. FIG. 2 is a diagram illustrating a front side view of the semiconductor chip.

The semiconductor device includes a low voltage (LV) circuit section 1 and a high voltage (HV) circuit section 2. The LV circuit section 1 provides a zero volt reference circuit. The HV circuit section 2 provides, for example, a 600-to-1200 volt reference circuit. The semiconductor device can be used to drive, for example, an insulated gate bipolar transistor (IGBT), which is not shown in the drawings.

The semiconductor device has a high-voltage metal-oxide semiconductor field-effect transistor (MOSFET) 3 for level shifting. The MOSFET 3 is located across (astride) the border between the LV circuit section 1 and the HV circuit section 2. Although not shown in the drawings, the semiconductor device has a driver circuit section for driving the IGBT. For example, the driver circuit can include a power MOSFET, a bipolar transistor, a complementary metal-oxide semiconductor (CMOS), and/or the like.

Trenches 5-7 are formed to an n$^-$-type drift layer 4 (as a first conductivity layer) of the semiconductor device. The n$^-$-type drift layer 4 has a front side (upper side of FIG. 1) and a back side (lower side of FIG. 1) opposite to the front side. Each of the trenches 5-7 penetrates through the n$^-$-type drift layer 4 from the front side to the back side of the n$^-$-type drift layer 4. Each of the trenches 5-7 is filled with an insulation layer made from, for example, a thermally oxidized film and a polysilicon film. The trench 5 surrounds both the LV circuit section 1 and the HV circuit section 2. The trench 6 surrounds the HV circuit section 2. Thus, trench isolation is achieved so that the LV circuit section 1 and the HV circuit section 2 can be electrically and physically isolated from each other by the trench 6.

The trench 7 surrounds a part of the LV circuit section 1 and a part of the HV circuit section 2. The MOSFET 3 is formed in an area surrounded by the trench 7. The area surrounded by the trench 7 is divided into two by the trench 6, which isolates the LV circuit section 1 and the HV circuit section 2 from each other. Accordingly, the MOSFET 3 is divided by the trench 6 into two, one of which is defined as an element portion 8, and the other of which is defined as a wiring portion 9.

In the element portion 8 of the MOSFET 3, a p-type channel region 10 is formed to a surface portion of the front side of the n$^-$-type drift layer 4. An n$^+$-type source region 11 (as a first conductivity type semiconductor region) and a p$^+$-type contact region 12 are formed in the p-type channel region 10. The n$^+$-type source region 11 has an n-type impurity concentration higher than that of the n$^-$-type drift layer 4. The p$^+$-type contact region 12 has a p-type impurity concentration higher than that of the p-type channel region 10. Further, an n$^+$-type drain contact region 13 is formed to a surface portion of the back side of the n$^-$-type drift layer 4. The n$^+$-type drain contact region 13 has an n-type impurity concentration higher than that of the n$^-$-type drift layer 4.

A LOCOS (local oxidation of silicon) oxide film 14 is formed to a surface of the front side of the n$^-$-type drift layer 4. The LOCOS oxide film 14 has an opening where the p-type channel region 10, the n$^+$-type source region 11, and the p$^+$-type contact region 12 are exposed. A gate electrode 16 is formed through a gate insulation film 15 on an exposed surface of the p-type channel region 10 between the n$^-$-type drift layer 4 and the n$^+$-type source region 11. Further, an interlayer insulation film 17 is formed on the surface of the front side of the n$^-$-type drift layer 4. The gate electrode 16, the gate insulation film 15, and the LOCOS oxide film 14 are covered with the interlayer insulation film 17. The interlayer insulation film 17 has a contact hole. A source wiring 18 is formed on the surface of the front side of the n$^-$-type drift layer 4. The source wiring 18 passes though the contact hole of the interlayer insulation film 17 and is in ohmic contact with each of the n$^+$-type source region 11 and the p$^+$-type contact region 12. The source wiring 18 can be, for example, made of aluminum. The source wiring 18 extends toward the LV circuit section 1 side along a surface of the interlayer insulation film 17. That is, the source wiring 18 extends in a direction away from the HV circuit section 2.

Further, a backside electrode 19 is formed to the surface of the back side of the n$^{31}$-type drift layer 4. The backside electrode 19 is in ohmic contact with the n$^+$-type drain contact region 13. For example, the backside electrode 19 can be made of aluminum and have a thickness of about 1 micrometer (μm). The backside electrode 19 is located in the area surrounded by the trench 7 to prevent a short-circuit between the backside electrode 19 and a portion of the LV circuit section 1 outside the area surrounded by the trench 7.

In the wiring portion 9 of the MOSFET 3, an n-type well region 20 is formed to a surface portion of the front side of the n$^-$-type drift layer 4. An n$^+$-type contact region 21 is formed to a surface portion of the n-type well region 20. An n$^+$-type contact region 22 is formed to a surface portion of the back side of the n$^-$-type drift layer 4. Further, the interlayer insulation film 17 is formed on the surface of the front side of the n$^-$-type drift layer 4. The interlayer insulation film 17 is has a contact hole. A drain wiring 23 is formed on the surface of the front side of the n$^-$-type drift layer 4. The drain wiring 23 passes though the contact hole of the interlayer insulation film 17 and is in ohmic contact with the n$^+$-type contact region 21. The drain wiring 23 can be, for example, made of aluminum. The drain wiring 23 extends toward the HV circuit section 2 side along a surface of the interlayer insulation film 17. That is, the drain wiring 23 extends in a direction away from the LV circuit section 1. In this way, the source wiring 18 and the drain wiring 23 extend in opposite directions.

The backside electrode 19, which is formed in the element portion 8, is elongated to the wiring portion 9 and is in ohmic contact with the n$^+$-type contact region 22. As noted previously, the backside electrode 19 is located in the area surrounded by the trench 7. Therefore, a short-circuit between the backside electrode 19 and a portion of the HV circuit section 1 outside the area surrounded by the trench 7 can be prevented. If necessary, an interlayer insulation film 24 is formed to cover the entire front side of the semiconductor device. Other wiring layers (not shown) can be added to the semiconductor device. Protection films 25, 26 are formed to the front and back sides of the semiconductor device, respectively. The semiconductor device according to the first embodiment is constructed in the above described manner.

The semiconductor device operates in the following manner. When a predetermined voltage is applied to the gate electrode 16, a channel is created in a surface portion of the p-type channel region 10 directly below the gate insulation film 15. As a result, an electric current flows between the source wiring 18 and the drain wiring 23 through the n$^+$-type source region 11, the channel created in the p-type channel region 10, the n$^-$-type drift layer 4 of the element portion 8, the n$^+$-type drain contact region 13, the backside electrode 19, the n$^+$-type contact region 22, the n$^-$-type drift layer 4 of the wiring portion 9, the n-type well region 20, and the n$^+$-type contact region 21. When the electric current flows, a potential of each portion of the semiconductor device changes depending on operating conditions of the IGBT driven by the semiconductor device. For example, in the first embodiment, a potential of 0 volt is applied to the source wiring 18, and a potential of from 600 to 1200 volts is applied to the drain wiring 23. As a result, a high voltage of from 600 to 1200 volts is applied between the source wiring 18 and the drain wiring 23.

The semiconductor device according to the first embodiment can withstand the high voltage for the following reasons. In the element portion 8 of the MOSFET 3, the backside electrode 19 is formed on the back side of the n$^-$-type drift layer 4. The electric current flows to the backside electrode 19 from the source wiring 18 formed on the front side of the n$^-$-type drift layer 4. That is, the electric current flows from the front side to the back side of the n$^-$-type drift layer 4 in a thickness direction of the n$^-$-type drift layer 4.

The backside electrode 19 is elongated from the element portion 8 to the wiring portion 9 and coupled to the drain wiring 23 via the n$^+$-type contact region 22, the n$^-$-type drift layer 4 of the wiring portion 9, the n-type well region 20, and the n$^+$-type contact region 21. That is, the drain wiring 23 is pulled outside the element portion 8 using the backside electrode 19 and the wiring portion 9. In this way, the backside electrode 19 and the wiring portion 9 provide a pulling wire that allows the electric current to flow to the drain wiring 23. In such an approach, the drain wiring 23 does not pass above the source wiring 18, and the interlayer insulation film 17 is not located between the source wiring 18 and the drain wiring 23. Therefore, even when the voltage (i.e., potential difference) between the source wiring 18 and the drain wiring 23 is large, breakdown of the interlayer insulation film 17 due to the voltage can be prevented.

Figure 3:
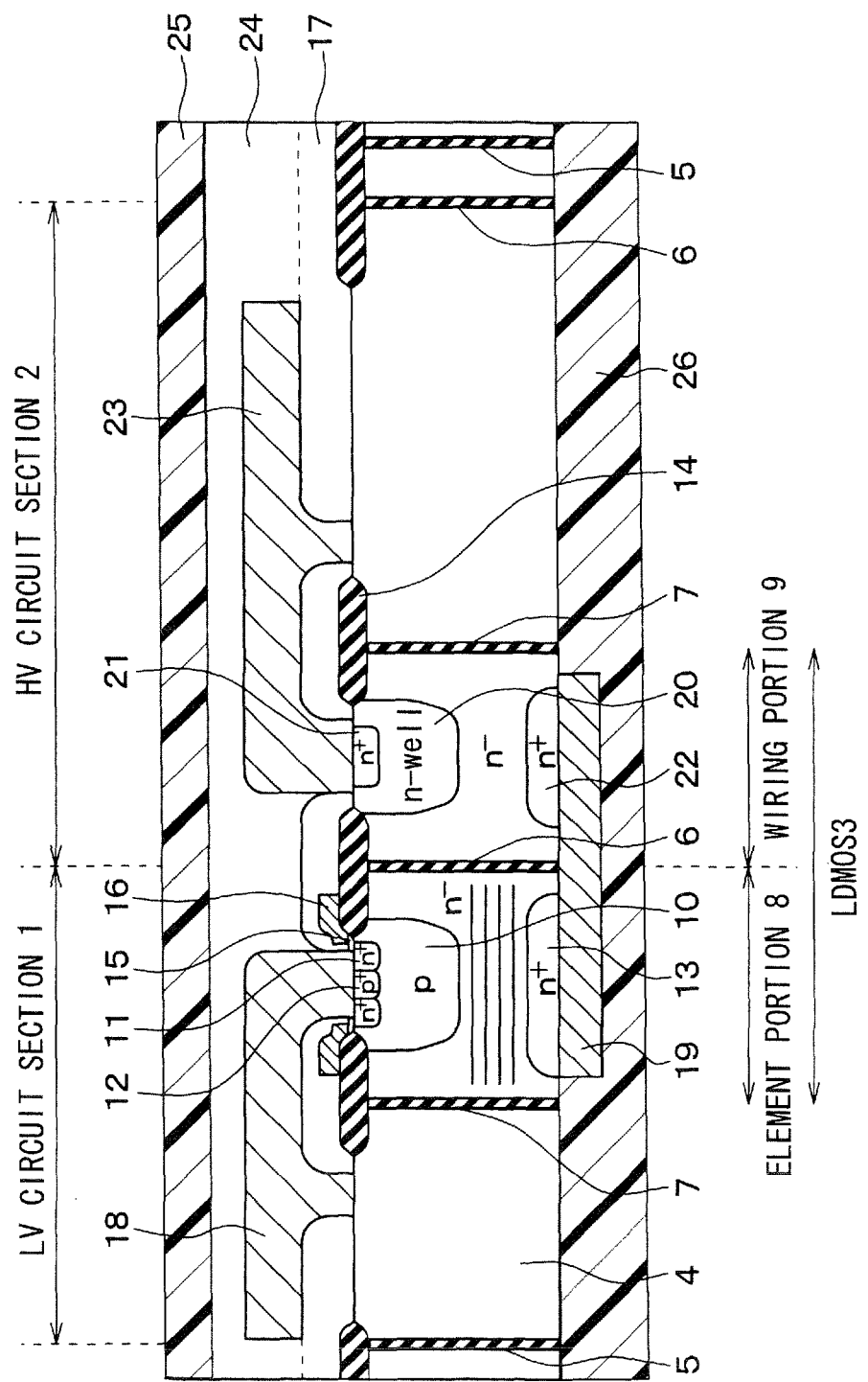
FIG. 3 is a diagram illustrating a potential distribution in the semiconductor device of FIG. 1.

Further, the electric current flows between the source wiring 18 and the backside electrode 19 in the thickness direction of the n$^-$-type drift layer 4. Therefore, breakdown of the LOCOS oxide film 14 and the interlayer insulation film 17 due to an electric field concentration can be prevented so that the semiconductor device can have a high breakdown voltage. Specifically, as shown in FIG. 3, a potential distribution in the element portion 8 of the MOSFET 3 is substantially uniform and parallel to the surface of the n$^-$-type drift layer 4. Therefore, the electric field concentration is prevented so that the semiconductor device can have a high breakdown voltage.

A method of making the semiconductor device (in particular, the MOSFET 3) is described below with reference to FIGS. 4A-6C.

Figure 4A:
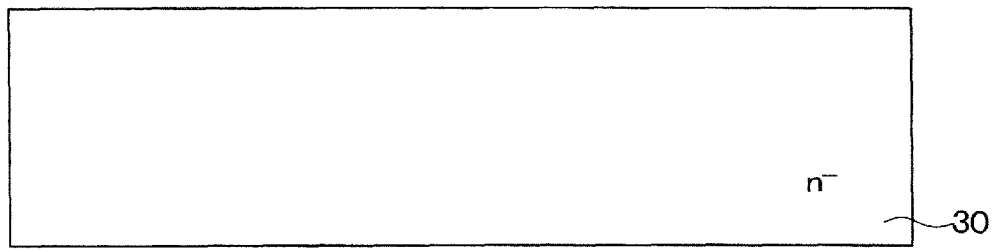
FIG. 4A is a diagram illustrating a first process of making the semiconductor device of FIG. 1.

Firstly, as shown in FIG. 4A, a silicon substrate 30 for the n$^-$-type drift layer 4 is prepared. The silicon substrate 30 has a thickness greater than a depth of each of the trenches 5-7.

Figure 4B:
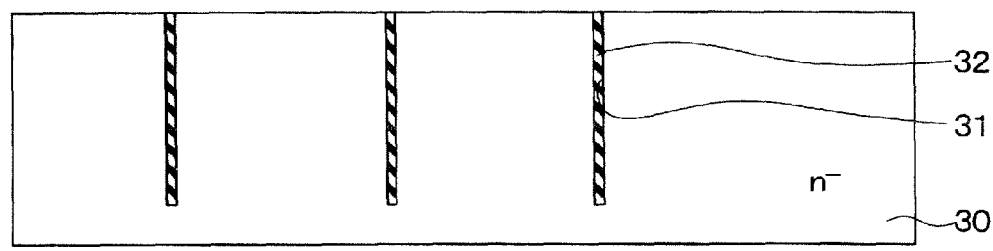
FIG. 4B is a diagram illustrating a second process of making the semiconductor device of FIG. 1.

Next, as shown in FIG. 4B, a trench 31 is formed to the silicon substrate 30 from a front side of the silicon substrate 30 by a photolithography process and an etching process. Then, an oxide film is formed on an inner surface of the trench 31 by a thermal oxidation process. Then, a polysilicon (poly-Si) layer is formed on the oxide film. Thus, the trench 31 is filled with an insulation layer 32 that is made from the oxide film and the polysilicon layer. Then, the oxide film and the polysilicon layer left on the front side of the silicon substrate 30 is removed so that the insulation layer 32 can remain only inside the trench 31.

Figure 4C:
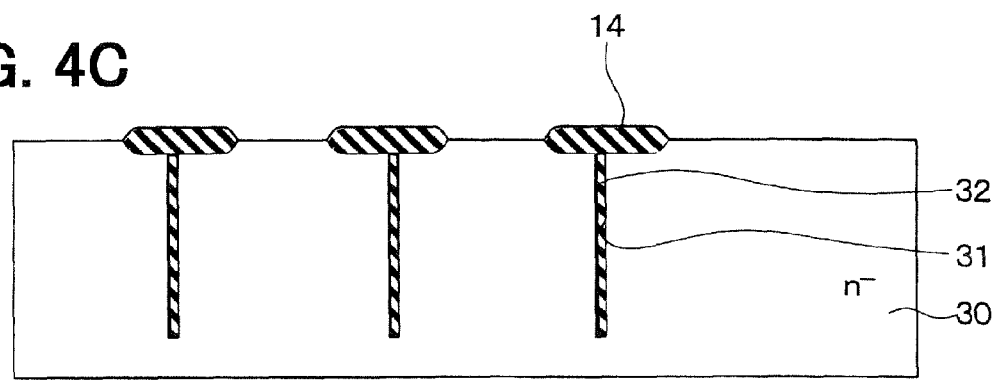
FIG. 4C is a diagram illustrating a third process of making the semiconductor device of FIG. 1.

Next, as shown in FIG. 4C, the LOCOS oxide film 14 is formed on the front side of the silicon substrate 30. Specifically, a base layer (not shown) made from, for example, an oxide film and an nitride film is formed on the front side of the silicon substrate 30, and then an opening is formed to the base layer by a patterning process. Then, a LOCOS process is applied to the base layer so that the LOCOS oxide film 14 can be formed in the opening. Then, the base layer is removed so that the LOCOS oxide film 14 can remain on the first front side of the silicon substrate 30.

Figure 5A:
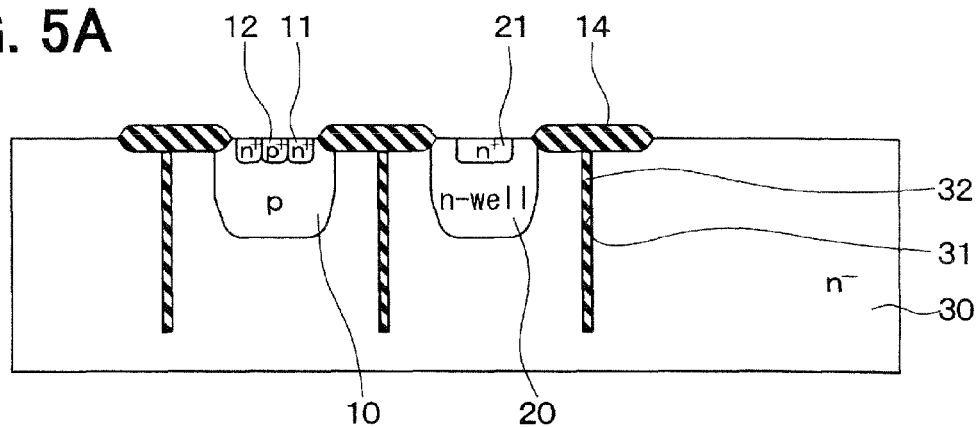
FIG. 5A is a diagram illustrating a fourth process of making the semiconductor device of FIG. 1.

Next, as shown in FIG. 5A, the p-type channel region 10 and the n-type well region 20 are formed to the surface portion of the front side of the silicon substrate 30. Specifically, a first mask having an opening corresponding to the p-type channel region 10 is placed on the front side of the silicon substrate 30 and the LOCOS oxide film 14. Then, a p-type impurity is implanted through the first mask into the silicon substrate 30 by an ion implantation process. Then, the first mask is removed, and a second mask having an opening corresponding to the n-type well region 20 is placed on the front side of the silicon substrate 30 and the LOCOS oxide film 14. Then, an n-type impurity is implanted through the second mask into the silicon substrate 30 by an ion implantation process. Then, the implanted impurities are diffused by a thermal treatment process so that the p-type channel region 10 and the n-type well region 20 can be formed to the surface portion of the front side of the silicon substrate 30.

Further, a third mask having openings corresponding to the n+-type source region 11 and the n$^+$-type contact region 21 is placed on the front side of the silicon substrate 30 and the LOCOS oxide film 14. Then, a n-type impurity is implanted through the third mask into the silicon substrate 30 by an ion implantation process. Then, the third mask is removed, and a fourth mask having an opening corresponding to the p$^+$-type contact region 12 is placed on the front side of the silicon substrate 30 and the LOCOS oxide film 14. Then, a p-type impurity is implanted through the fourth mask into the silicon substrate 30 by an ion implantation process. Then, the implanted impurities are diffused by a thermal treatment process so that the n+-type source region 11, the n$^+$-type contact region 21, and the p$^+$-type contact region 12 can be formed to the surface portion of the front side of the silicon substrate 30.

Figure 5B:
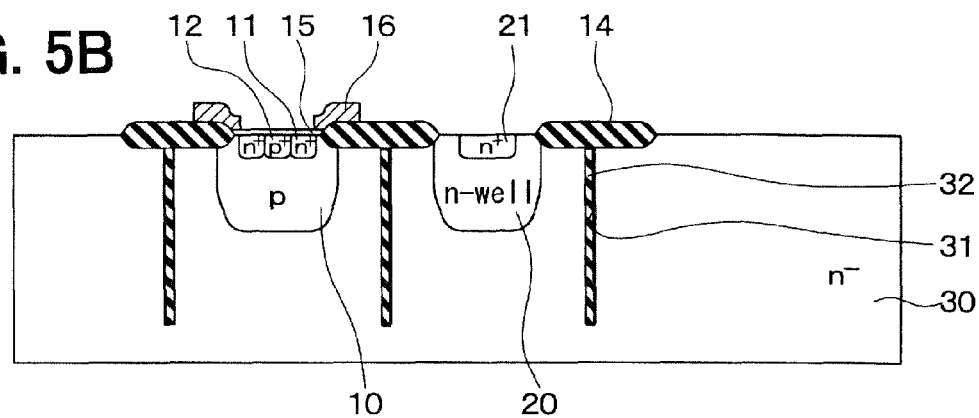
FIG. 5B is a diagram illustrating a fifth process of making the semiconductor device of FIG. 1.

Next, as shown in FIG. 5B, the gate insulation film 15 is formed by a thermal oxidation process. Then, a polysilicon layer to which an impurity is doped is formed on the insulation film 15. Then, the gate electrode 16 is formed by patterning the polysilicon layer.

Figure 5C:
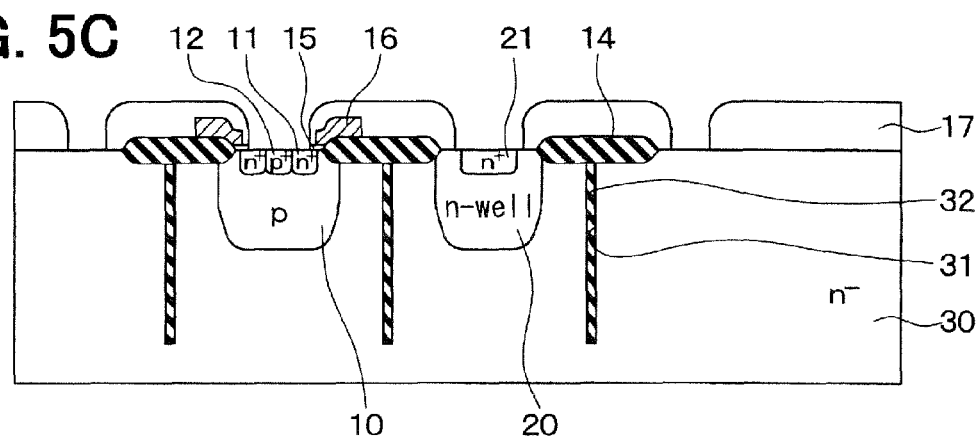
FIG. 5C is a diagram illustrating a sixth process of making the semiconductor device of FIG. 1.

Next, as shown in FIG. 5C, the interlayer insulation film 17 is placed on the front side of the silicon substrate 30 so that the front side of the silicon substrate 30 and the gate electrode 16 can be entirely covered with the interlayer insulation film 17. The interlayer insulation film 17 is patterned to form a first contact hole where both the n+-type source region 11 and the p$^+$-type contact region 12 are exposed and a second contact hole where the n$^+$-type contact region 21.

Figure 6A:
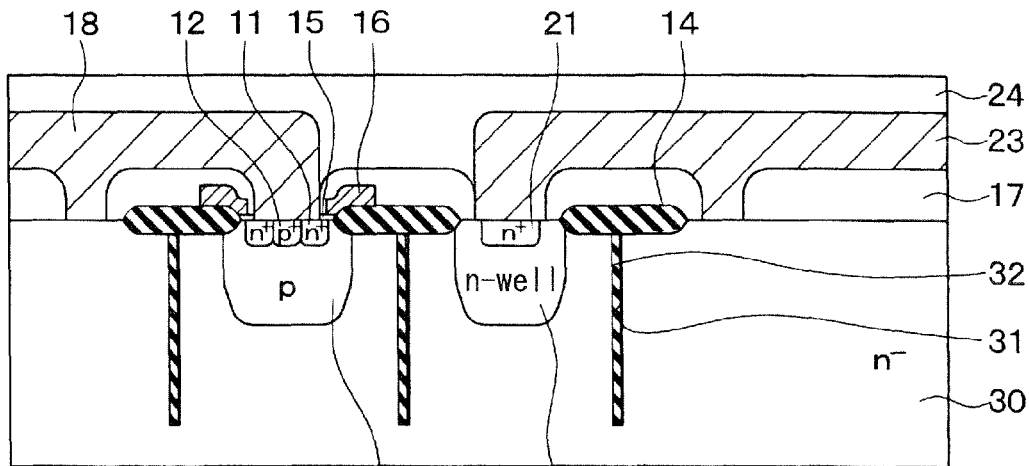
FIG. 6A is a diagram illustrating a seventh process of making the semiconductor device of FIG. 1.

Next, as shown in FIG. 6A, the source wiring 18 and the drain wiring 23 are formed. Specifically, a wiring layer made of, for example, aluminum is formed on the interlayer insulation film 17 such that the contact holes of the interlayer insulation film 17 can be filled with the wiring layer. Then, the source wiring 18 and the drain wiring 23 are formed by pattering the wiring layer. If necessary, the interlayer insulation film 24 and an additional wiring layer are formed on the source wiring 18 and the drain wiring 23.

Figure 6B:
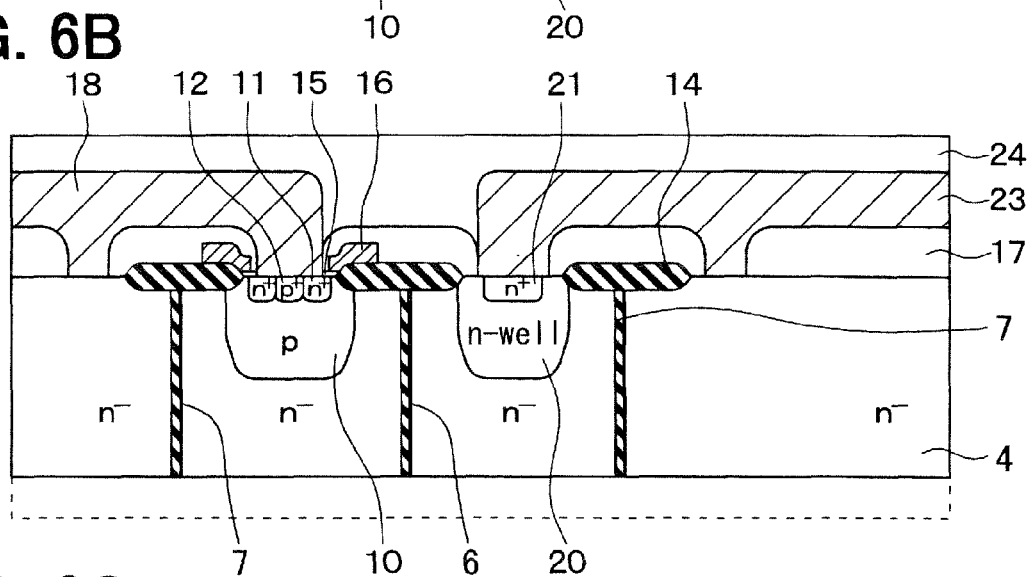
FIG. 6B is a diagram illustrating an eighth process of making the semiconductor device of FIG. 1.

Next, as shown in FIG. 6B, the silicon substrate 30 is thinned to a predetermined thickness by polishing the back side of the silicon substrate 30, for example, by a chemical mechanical polishing (CMP) process. Consequently, the n$^-$-type drift layer 4 is completed, and the trenches 5-7 penetrate through the n$^-$-type drift layer 4 so that trench isolation can be achieved.

Figure 6C:
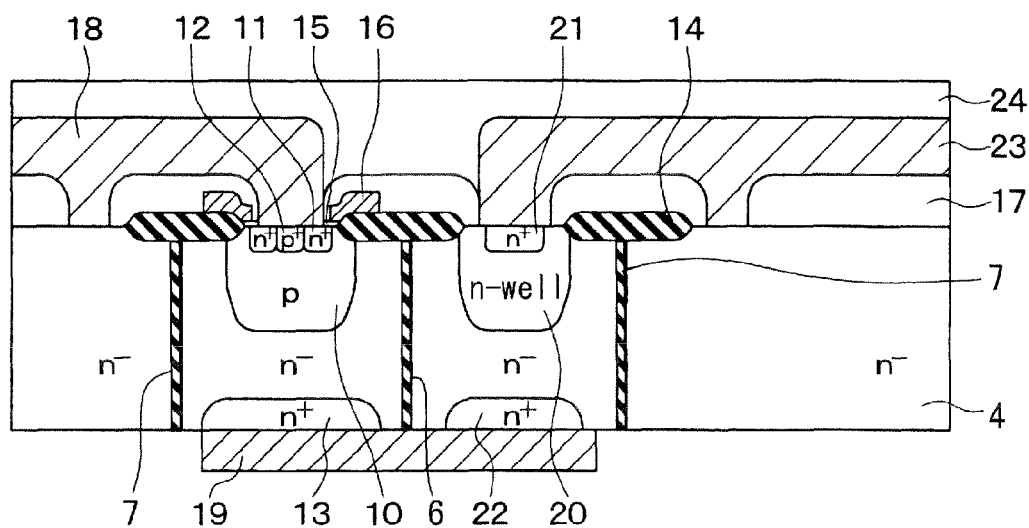
FIG. 6C is a diagram illustrating a ninth process of making the semiconductor device of FIG. 1.

Next, as shown in FIG. 6C, a fifth mask having openings corresponding to the n$^+$-type drain contact region 13 and the n$^+$-type contact region 22 is placed on the back side of the n$^-$-type drift layer 4. Then, an n-type impurity is implanted through the fifth mask into the n+-type drift layer 4 by an ion implantation process. Then, the implanted impurity is diffused by a thermal treatment process so that the n+-type drain contact region 13 and the n+-type contact region 22 can be formed to the surface portion of the back side of the n−-type drift layer 4. Then, an electrode layer made of, for example, aluminum, is formed on the back side of the n−-type drift layer 4, the n+-type drain contact region 13, and the n+-type contact region 22. Then, the backside electrode 19 is formed by patterning the electrode layer.

Finally, the protection film 25 is formed on the interlayer insulation film 24, and the protection film 26 is formed on the back side of the n−-type drift layer 4 and the backside electrode 19. In this way, the semiconductor device according to the first embodiment can be made.

As described above, according to the semiconductor device of the first embodiment, since the drain wiring 23 does not pass above the source wiring 18, the interlayer insulation film 17 is not located between the source wiring 18 and the drain wiring 23. Therefore, even when the potential difference between the source wiring 18 and the drain wiring 23 is large, breakdown of the interlayer insulation film 17 cannot be caused by the potential difference.

Second Embodiment

A semiconductor device according to a second embodiment of the present invention is described below with reference to FIG. 7. A difference between the first and second embodiment is as follows.

Figure 7:
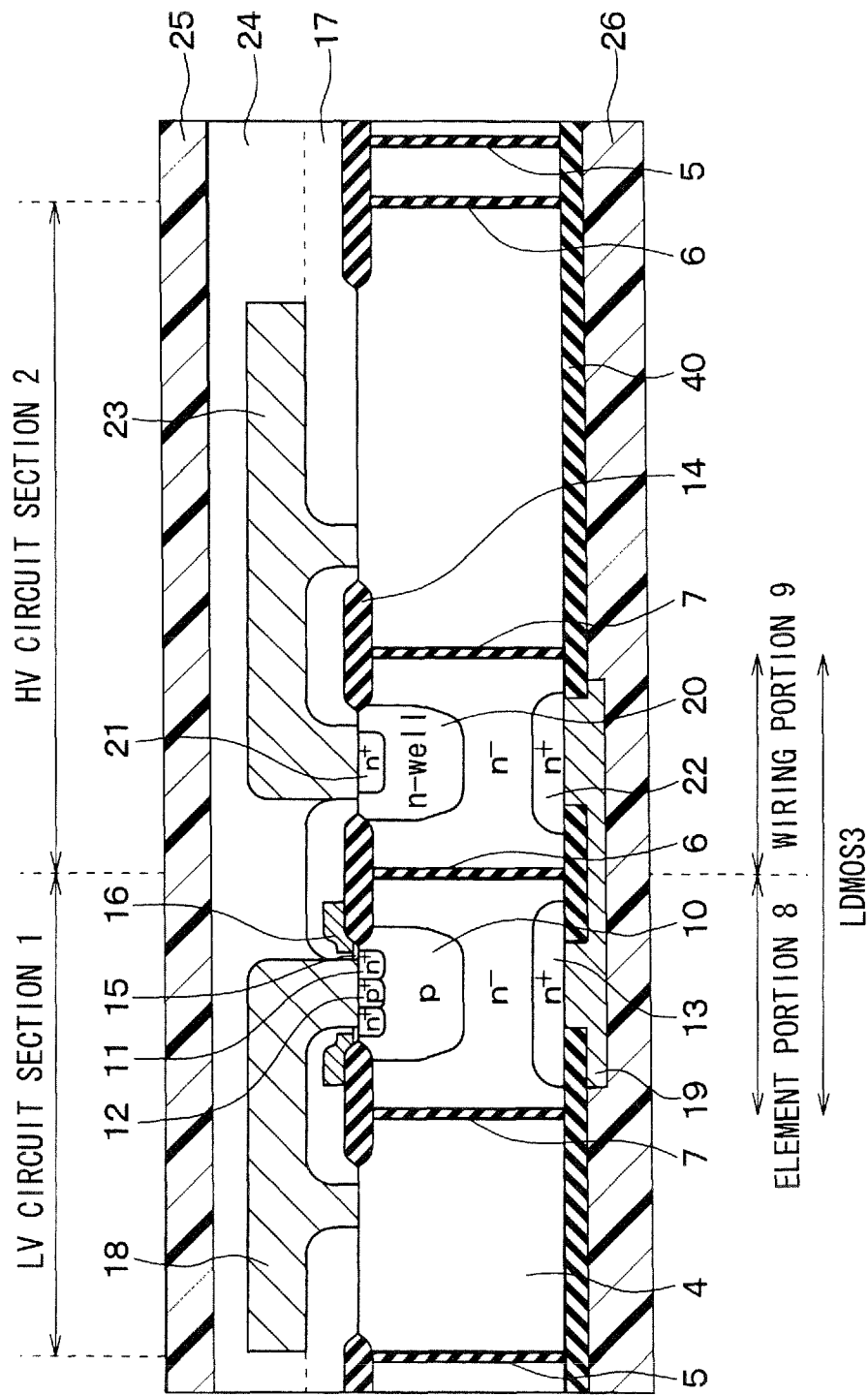
FIG. 7 is a diagram illustrating a cross-sectional view of a semiconductor device according to a second embodiment of the present invention.

FIG. 7 is a diagram illustrating a cross-sectional view of a semiconductor chip to which the semiconductor device is formed. In the second embodiment, an interlayer insulation film 40 having contact holes is formed to the surface of the back side of the n−-type drift layer 4. The backside electrode 19 is coupled to the n+-type drain contact region 13 and the n+-type contact region 22 through the respective contact holes.

As described above, according to the second embodiment, the interlayer insulation film 40 is formed on the back side of the n−-type drift layer 4. The backside electrode 19 is formed on the back side of the n−-type drift layer 4 through the interlayer insulation film 40. In such an approach, even when the backside electrode 19 spreads outside the trench 7 due to manufacturing variations, a short-circuit between the LV circuit section 1 and the HV circuit section 2 due to the backside electrode 19 can be prevented by the interlayer insulation film 40.

Third Embodiment

A semiconductor device according to a third embodiment of the present invention is described below with reference to FIGS. 8 and 9. A difference between the first and third embodiments is as follows.

Figure 8:
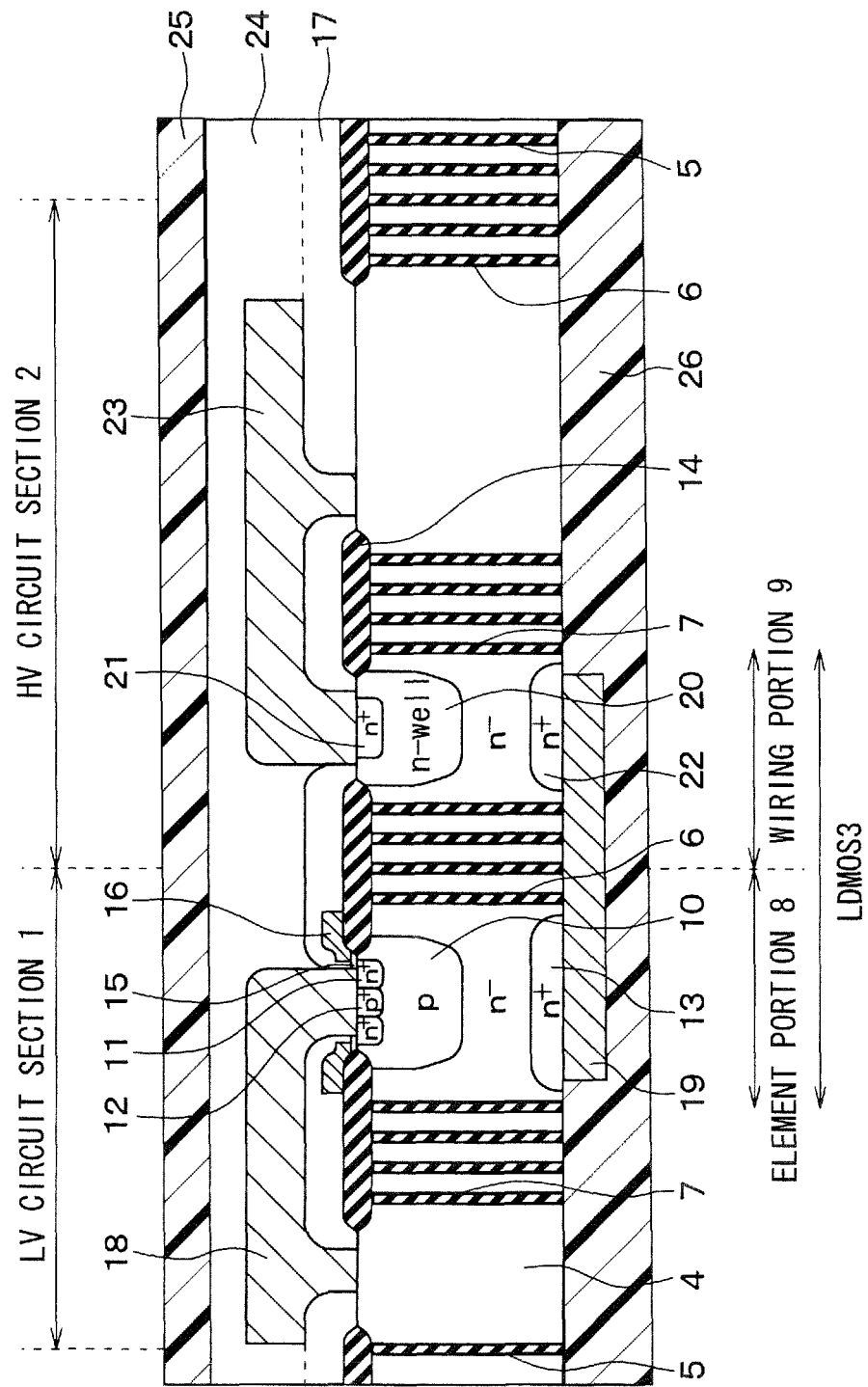
FIG. 8 is a diagram illustrating a cross-sectional view of a semiconductor device according to a third embodiment of the present invention.
Figure 9:
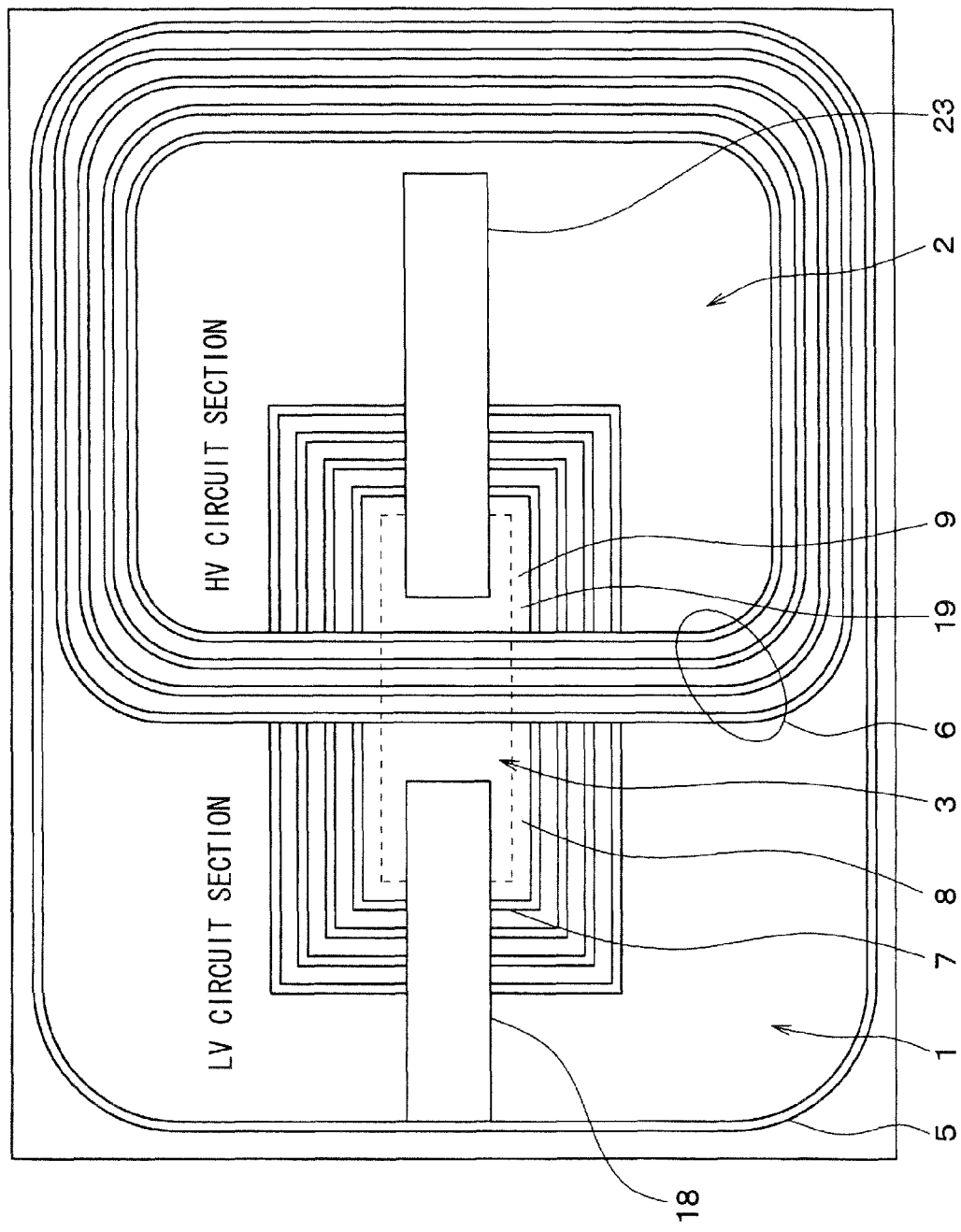
FIG. 9 is a diagram illustrating a front side view of the semiconductor device of FIG. 8.

FIG. 8 is a diagram illustrating a cross-sectional view of a semiconductor chip to which the semiconductor device is formed. FIG. 9 is a diagram illustrating a front side view of the semiconductor chip of FIG. 8.

In the third embodiment, the HV circuit section 2 is surrounded by multiple (i.e., four) trenches 6. The multiple trenches 6 provide an improved isolation between the LC circuit section 1 and the HV circuit section 2 so that the semiconductor device can have a high breakdown voltage.

Further, the MOSFET 3 is surrounded by multiple (i.e., four) trenches 7. As can be seen from FIG. 9, the trenches 7 are not formed in areas between adjacent trenches 6. Alternatively, the trenches 7 can be formed in the areas between adjacent trenches 6.

Fourth Embodiment

A semiconductor device according to a fourth embodiment of the present invention is described below with reference to FIGS. 10 and 11. A difference between the first and fourth embodiments is as follows.

Figure 10:
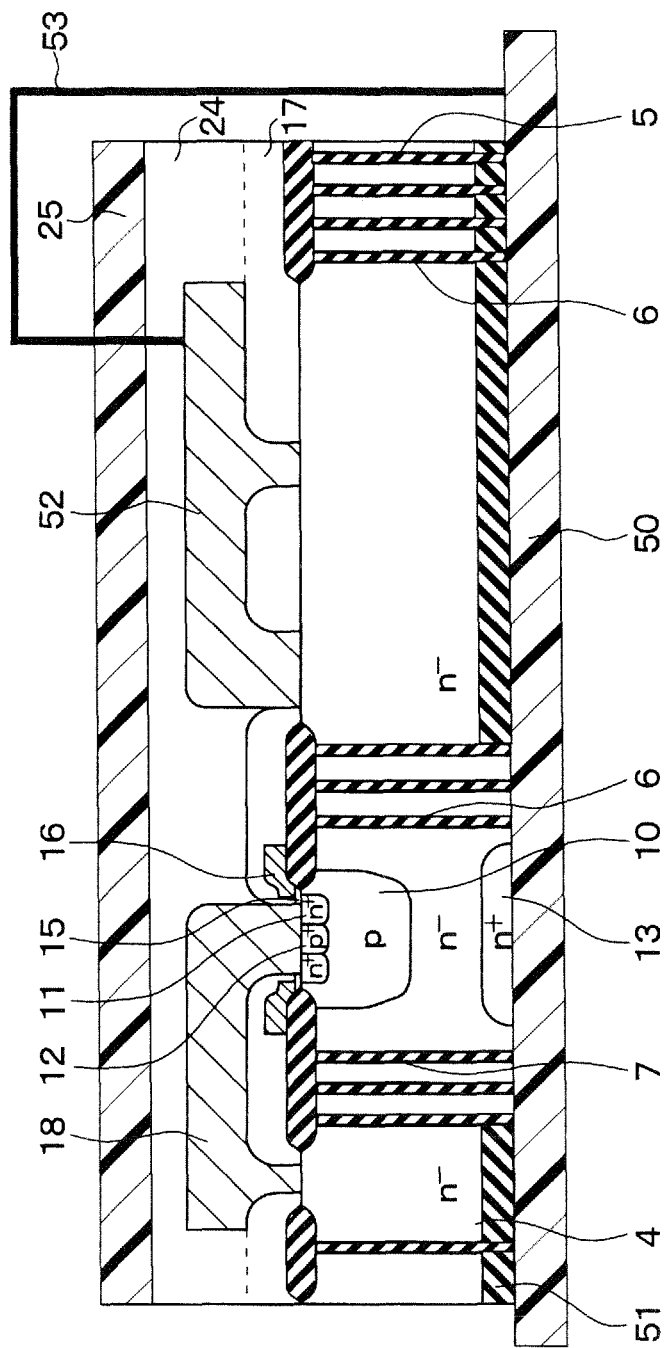
FIG. 10 is a diagram illustrating a cross-sectional view of a semiconductor device according to a fourth embodiment of the present invention.
Figure 11:
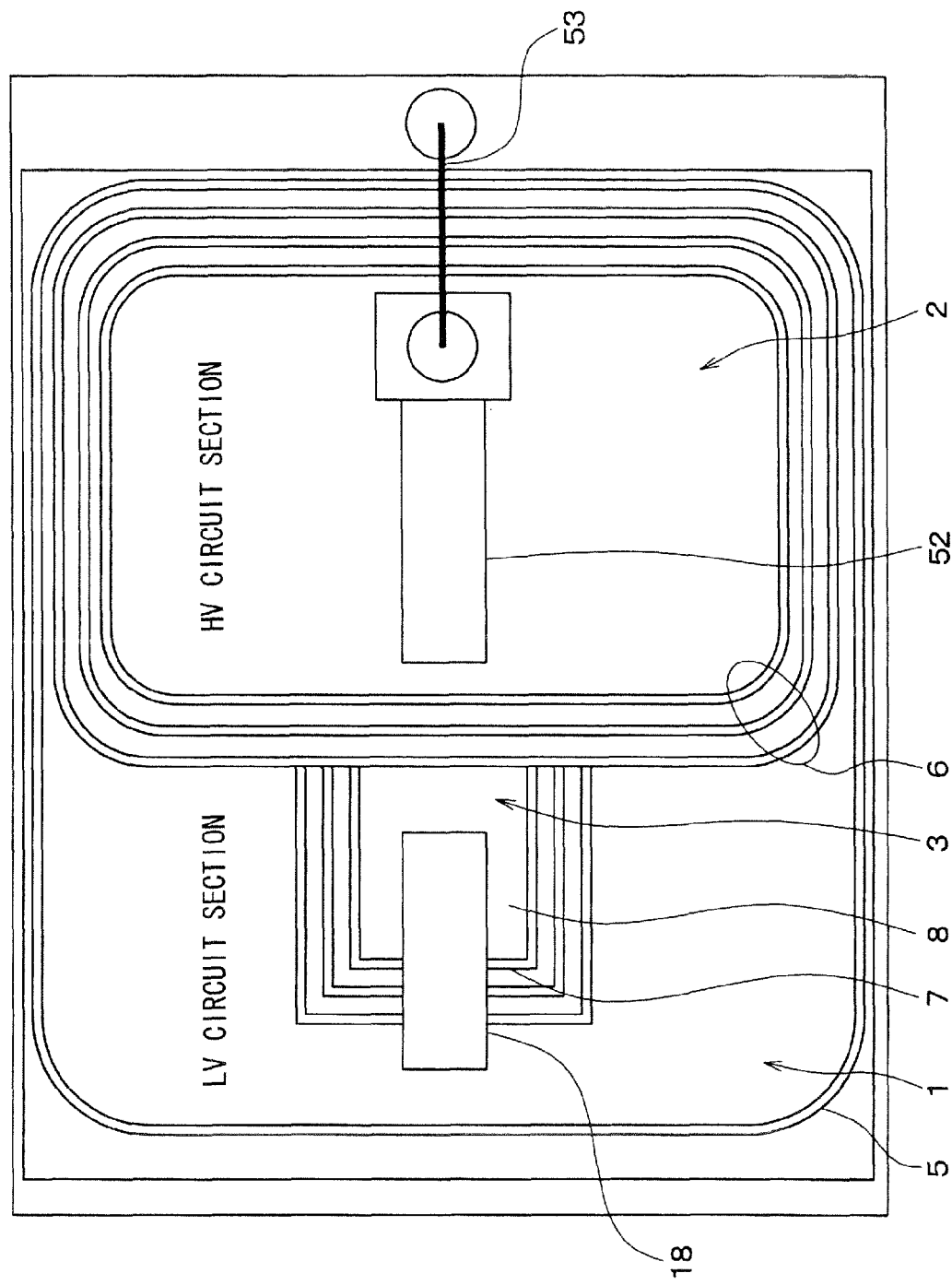
FIG. 11 is a diagram illustrating a front side view of the semiconductor device of FIG. 10.

FIG. 10 is a diagram illustrating a cross-sectional view of a semiconductor chip to which the semiconductor device is formed. FIG. 11 is a diagram illustrating a front side view of the semiconductor chip of FIG. 10.

In the fourth embodiment, a lead frame 50 is used instead of the backside electrode 19. The lead frame 50 is placed on the back side of the n−-type drift layer 4. Specifically, the lead frame 50 is bonded to the n+-type drain contact region 13 and an insulation film 51 formed on the surface of the back side of the n−-type drift layer 4.

In the fourth embodiment, there is no wiring portion 9. The lead frame 50 has a projection projecting from the edge of the semiconductor chip (i.e., the edge of the n−-type drift layer 4). The projection of the lead frame 50 is coupled to a pad portion of a power supply wiring 52 through a bonding wire 53. The power supply wiring 52 is used to apply a voltage to the HV circuit section 2. The pad portion of the power supply wiring 52 is exposed outside the interlayer insulation film 24 and the protection film 25 so that the power supply wiring 52 and the lead frame 50 can be electrically coupled together by the bonding wire 53. That is, the power supply wiring 52 is pulled outside the element portion 8 using the lead frame 50 and the bonding wire 53. In this way, the lead frame 50 and the bonding wire 53 provide a pulling wire that allows the electric current to flow to the power supply wiring 52.

The insulation film 51 provides an electrical isolation between the lead frame 50 and the n−-type drift layer 4 of the LV circuit section 1 and the HV circuit section 2. That is, the insulation film 51 prevents the n+-type drain contact region 13 from being short-circuited through the lead frame 50 to the n−-type drift layer 4 of the LV circuit section 1 and the HV circuit section 2.

For example, the lead frame 50 can be placed on the back side of the n−-type drift layer 4 in the following manner. Firstly, a predetermined thickness of the back side of the n−-type drift layer 4 of the LV circuit section 1 and the HV circuit section 2 is removed, and then the insulation film 51 is placed on the backside of the n−-type drift layer 4. Then, the insulation film 51 is polished, for example, by a chemical mechanical polishing method, until the n+-type drain contact region 13 is exposed. Then, the lead frame 50 is bonded to the n+-type drain contact region 13 and the insulation film 51. Thus, the lead frame 50 is placed on the back side of the n−-type drift layer 4.

Further, like the third embodiment, the HV circuit section 2 is surrounded by multiple (i.e., three) trenches 6, and the MOSFET 3 (i.e., element portion 8) is surrounded by multiple (i.e., three) trenches 7.

As described above, according to the fourth embodiment, the lead frame 50 is placed on the back side of the n−-type drift layer 4. The lead frame 50 is pulled to the front side of the semiconductor chip using the bonding wire 53. Thus, the lead frame 50 and the bonding wire 53 serve as the wiring portion 9.

Fifth Embodiment

A semiconductor device according to a fifth embodiment of the present invention is described below with reference to FIG. 12. A difference between the first and fifth embodiments is as follows.

Figure 12:
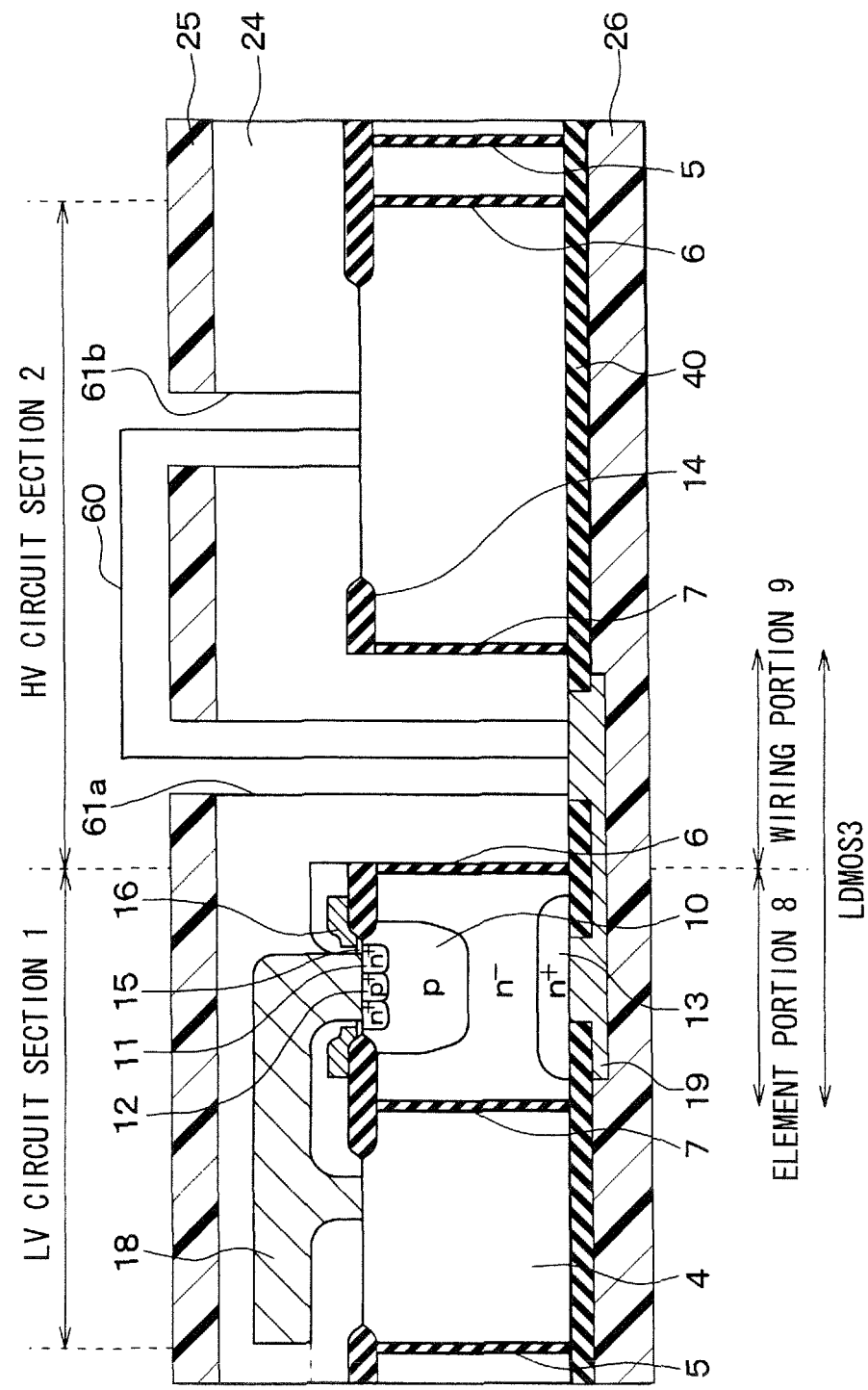
FIG. 12 is a diagram illustrating a cross-sectional view of a semiconductor device according to a fifth embodiment of the present invention.

FIG. 12 is a diagram illustrating a cross-sectional view of a semiconductor chip to which the semiconductor device is formed.

In the fifth embodiment, the semiconductor chip has through holes 61a, 61b on its front side. The through hole 61a reaches the backside electrode 19.

The through hole 61b reaches the $n^-$-type drift layer 4 of the HV circuit section 2. The backside electrode 19 and the $n^-$-type drift layer 4 are electrically coupled together by a bonding wire 60 that passes through the through holes 61a, 61b.

As described above, according to the fifth embodiment, the semiconductor chip has through holes 61a, 61b, and the bonding wire 60 passes through the through holes 61a, 61b. The backside electrode 19 and the $n^-$-type drift layer 4 of the HV circuit section 2 are electrically coupled together by the bonding wire 60. Thus, the bonding wire 60 is configured as part of the wiring portion 9.

Sixth Embodiment

A semiconductor device according to a sixth embodiment of the present invention is described below with reference to FIG. 13. A difference between the first and sixth embodiments is as follows.

Figure 13:
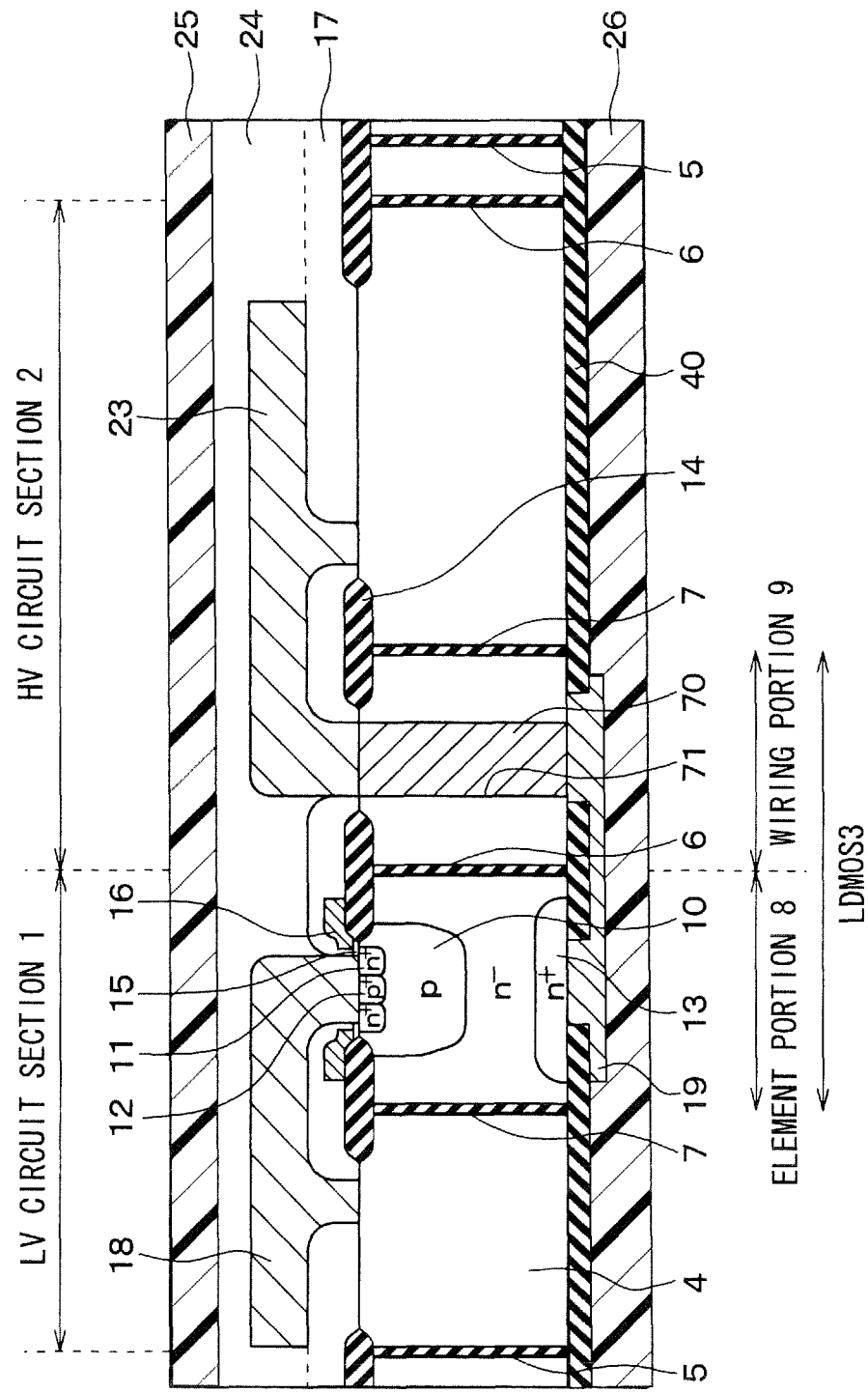
FIG. 13 is a diagram illustrating a cross-sectional view of a semiconductor device according to a sixth embodiment of the present invention.

FIG. 13 is a diagram illustrating a cross-sectional view of a semiconductor chip to which the semiconductor device is formed.

In the sixth embodiment, a conductive member 70 is formed in the $n^-$-type drift layer 4 and penetrates through the $n^-$-type drift layer 4 from the first side to the back side. The conductive member 70 is exposed to the surface of the first side of the $n^-$-type drift layer 4 at one end and electrically coupled to the drain wiring 23. Further, the conductive member 70 is exposed to the surface of the back side of the $n^-$-type drift layer 4 at the other end and electrically coupled to the backside electrode 19. For example, the conductive member 70 can be formed by filling a via hole 71 formed in the $n^-$-type drift layer 4 with a low-resistance material such as metal, doped-polysilicon, and/or the like.

As described above, according to the sixth embodiment, the conductive member 70 formed in the $n^-$-type drift layer 4 is configured as part of the wiring portion 9.

Seventh Embodiment

A semiconductor device according to a seventh embodiment of the present invention is described below with reference to FIG. 14. A difference between the first and seventh embodiments is as follows.

Figure 14:
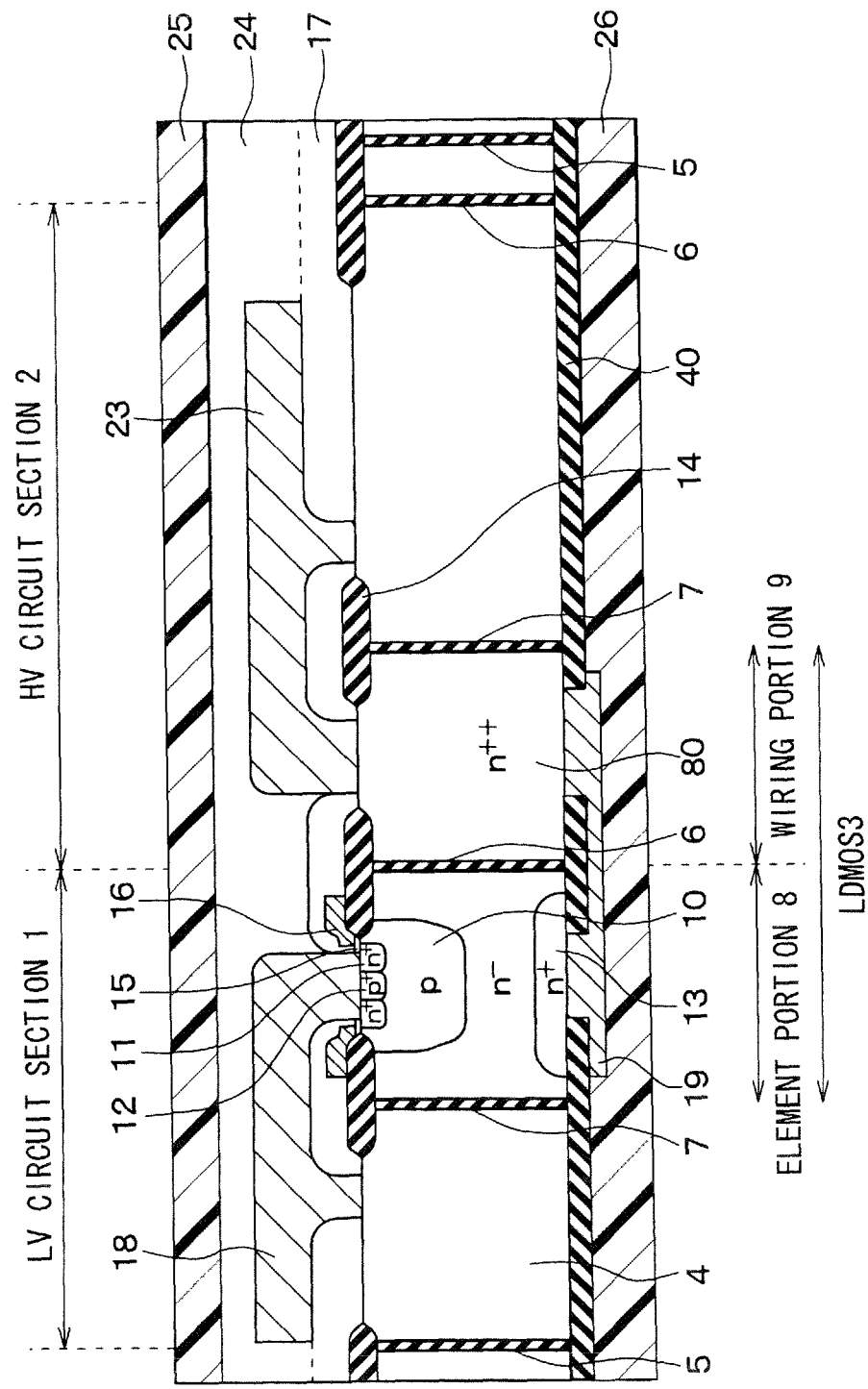
FIG. 14 is a diagram illustrating a cross-sectional view of a semiconductor device according to a seventh embodiment of the present invention.

FIG. 14 is a diagram illustrating a cross-sectional view of a semiconductor chip to which the semiconductor device is formed.

In the fifth embodiment, the $n^-$-type drift layer 4 of the wiring portion 9 is highly doped with an n-type impurity (or p-type impurity) to form a doped silicon layer 80. The backside electrode 19 and the drain wiring 23 are electrically coupled together through the doped silicon layer 80.

As described above, according to the seventh embodiment, the doped silicon layer 80 is configured as part of the wiring portion 9.

Eighth Embodiment

A semiconductor device according to an eighth embodiment of the present invention is described below with reference to FIG. 15. A difference between the first and eighth embodiments is as follows.

Figure 15:
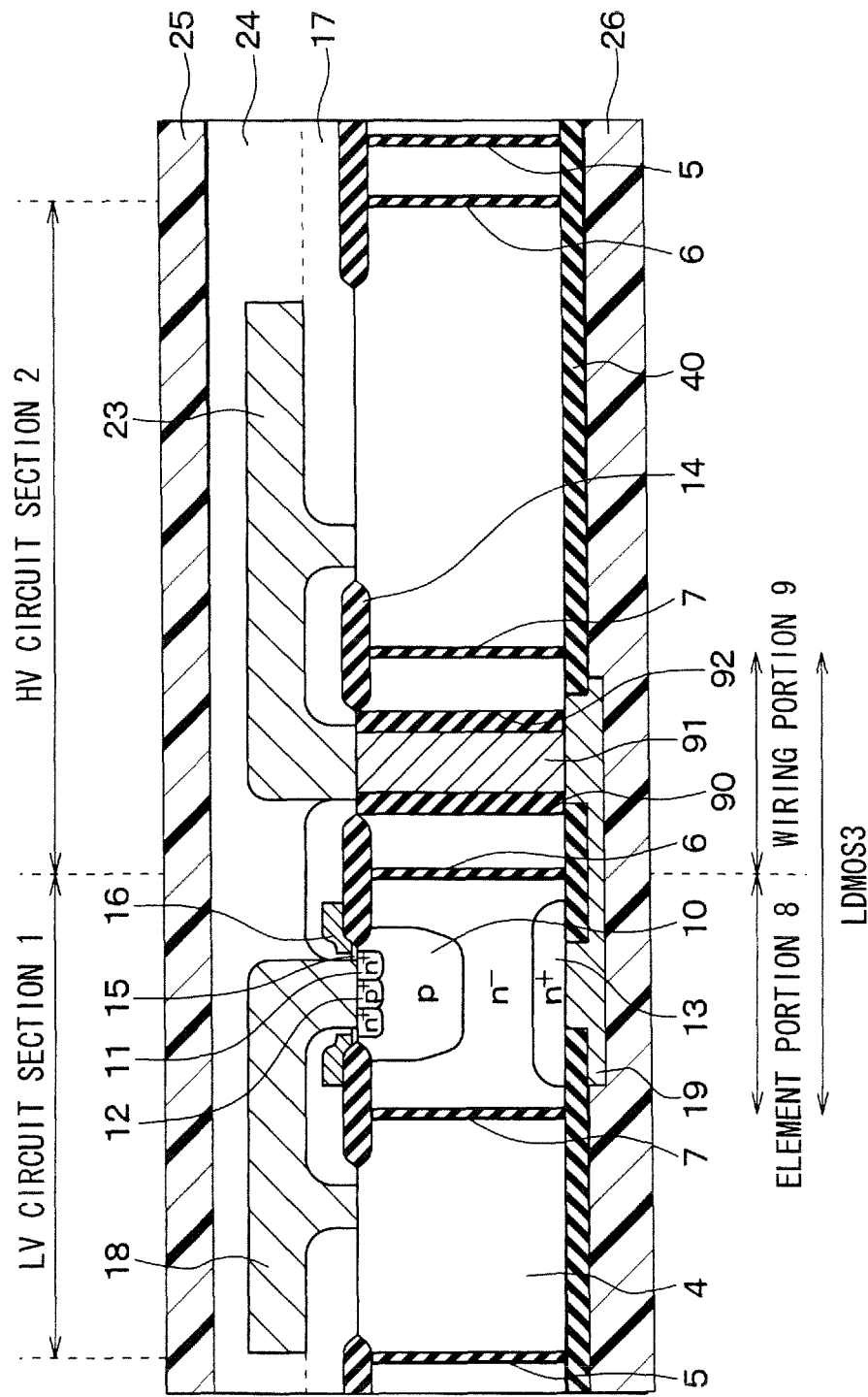
FIG. 15 is a diagram illustrating a cross-sectional view of a semiconductor device according to an eighth embodiment of the present invention.
Figure 16:
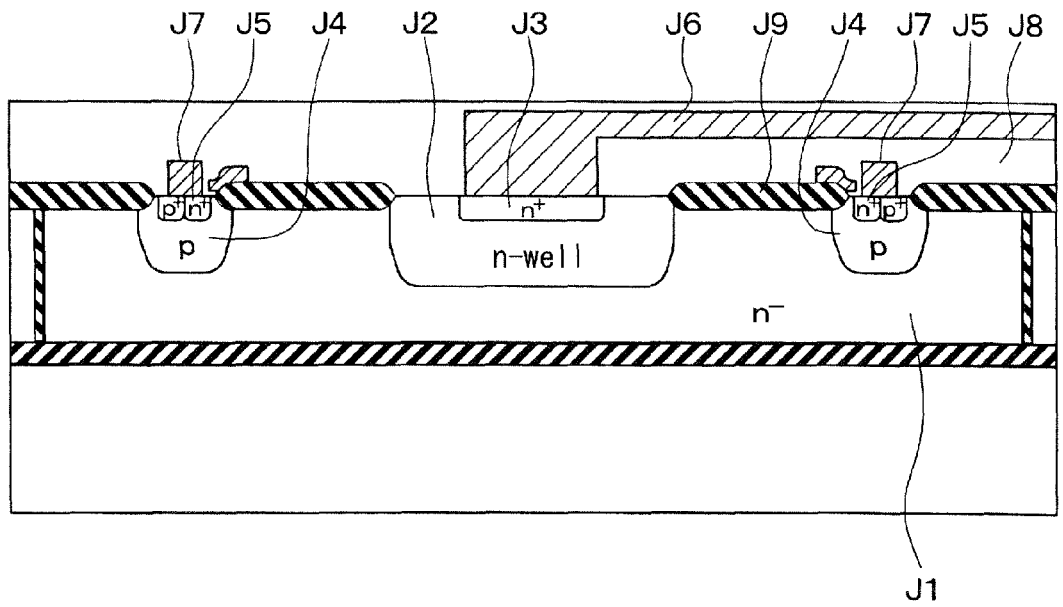
FIG. 16 is a diagram illustrating a cross-sectional view of a conventional semiconductor device.
Figure 17:
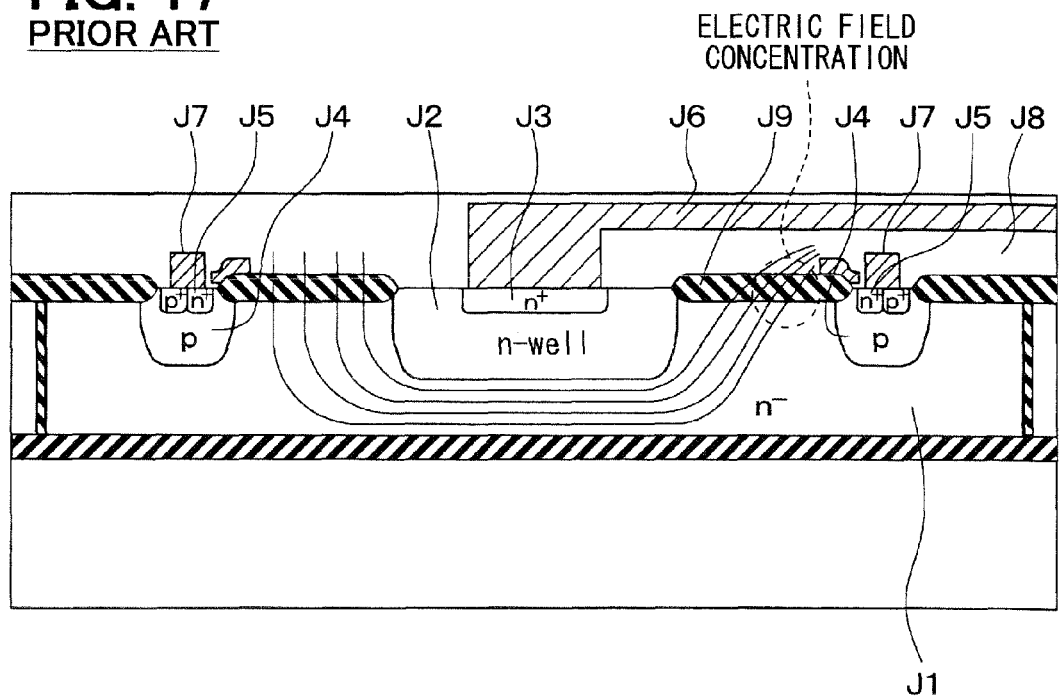
FIG. 17 is a diagram illustrating a potential distribution in the semiconductor device of FIG. 16.

FIG. 15 is a diagram illustrating a cross-sectional view of a semiconductor chip to which the semiconductor device is formed.

In the eighth embodiment, a conductive member 91 is formed through an insulation film 90 in the $n^-$-type drift layer 4 and penetrates through the $n^-$-type drift layer 4 from the first side to the back side. The conductive member 70 is exposed to the surface of the first side of the $n^-$-type drift layer 4 at one end and electrically coupled to the drain wiring 23. Further, the conductive member 70 is exposed to the surface of the back side of the $n^-$-type drift layer 4 at the other end and electrically coupled to the backside electrode 19. For example, this structure can be made in the following manner. Firstly, a via hole 92 is formed in the $n^-$-type drift layer 4, and then the insulation film 90 is formed on an inner wall of the via hole 92. Finally, the via hole 92 is filled a low-resistance material such as metal, doped-polysilicon, and/or the like.

As described above, according to the eighth embodiment, the conductive member 91 formed through the insulation film 90 in the $n^-$-type drift layer 4 is configured as part of the wiring portion 9.

(Modifications)

The embodiments described above can be modified in various ways. For example, the trench 5 can surround only the LV circuit section 1 so that the LV circuit section 1 and the HV circuit section 2 can be surrounded by the trenches 5, 6, respectively.

In the third and fourth embodiments, the number of the multiple trenches 6, 7 can vary according to a required breakdown voltage. In the first, second and third embodiments, the n-type well region 20, which reduces an internal resistance of the $n^-$-type drift layer 4, can be eliminated. Although the MOSFET 3 in the embodiments is of an n-channel type, the MOSFET 3 can be of a p-channel MOSFET. The MOSFET 3 can be replaced with other type of vertical MOSFET such as a planar MOSFET (e.g., disclosed in JP-A-H11-238742), a trench gate MOSFET (e.g., disclosed in US 2004/0173845 corresponding to JP-A-2004-266140), or a concave MOSFET (e.g., disclosed in U.S. Pat. No. 5,877,527 corresponding to JP-A-H09-293861).

The MOSFET 3 can be replaced with other type of a transistor such as a bipolar transistor, or an IGBT (insulated-gate bipolar transistor). In this case, an emitter wiring of the bipolar transistor or the IGBT corresponds to the source wiring 18, and a collector wiring of the bipolar transistor or the IGBT corresponds to the drain wiring 23.

Such changes and modifications are to be understood as being within the scope of the present invention as defined by the appended claims.

What is claimed is:

1. A semiconductor device comprising:
   a low voltage circuit section;
   a high voltage circuit section;
   a high-breakdown-voltage transistor configured to perform power conversion between the low voltage circuit section and the high voltage circuit section, the high-breakdown-voltage transistor including a semiconductor layer of a predetermined conductivity type, the semiconductor layer having front and back sides opposite to each other, the semiconductor layer including an element portion electrically isolated by a trench; and a power supply wiring formed on the front side of the semiconductor layer and configured to apply a voltage to the high voltage circuit section, wherein the element portion has a wiring member on the front side of the semiconductor layer and a lead frame on the back side of the semiconductor layer, the element portion being configured as a vertical transistor that causes an electric current to flow in a thickness direction of the semiconductor layer between the wiring member and the lead frame, wherein the lead frame has a projection projecting from an edge of the back side of the semiconductor layer, and wherein the projection of the lead frame is electrically coupled to the power supply wiring through a bonding wire.

2. A semiconductor device comprising:

a low voltage circuit section;

a high voltage circuit section;

a high-breakdown-voltage transistor configured to perform power conversion between the low voltage circuit section and the high voltage circuit section, the high-breakdown-voltage transistor including a semiconductor layer of a first conductivity type, the semiconductor layer having front and back sides opposite to each other, the semiconductor layer including an element portion electrically isolated by a trench; and a power supply wiring formed on the front side of the semiconductor layer and configured to apply a voltage to the high voltage circuit section, wherein the element portion comprises:
- a channel layer of a second conductivity type, the channel layer being formed to the semiconductor layer and exposed to the front side of the semiconductor layer;
- a semiconductor region of the first conductivity type, the semiconductor region being formed in the channel layer and having an impurity concentration higher than that of the semiconductor layer;
- a gate insulation film formed on an exposed surface of the channel layer between the semiconductor region and the semiconductor layer;
- a gate electrode formed on the gate insulation film;
- a wiring member electrically coupled to each of the semiconductor region and a contact region of the channel layer;
- a drain contact region of the first conductivity type, the drain contact region being formed on the back side of the semiconductor layer and having an impurity concentration higher than that of the semiconductor layer; and
- a lead frame formed on the back side of the semiconductor layer and electrically coupled to the drain contact region, wherein the element portion is configured as a vertical transistor that causes an electric current to flow in a thickness direction of the semiconductor layer between the wiring member and the lead frame, wherein the lead frame has a projection projecting from an edge of the back side of the semiconductor layer, and wherein the projection of the lead frame is electrically coupled to the power supply wiring through a bonding wire.

3. A semiconductor device according to claim 2, further comprising:

an insulation film formed on the back side of the semiconductor layer, the insulation film having an opening where the element portion is exposed, wherein the lead frame is bonded to the insulation film.

* * * * *